United States Patent
Hayashi et al.

(10) Patent No.: US 12,256,576 B2
(45) Date of Patent: Mar. 18, 2025

(54) DIFFERENTIAL AMPLIFIER GATED WITH QUANTUM DOTS ABSORBING INCIDENT ELECTROMAGNETIC RADIATION

(71) Applicant: The United States of America, as represented by the Secretary of the Navy, San Diego, CA (US)

(72) Inventors: Cody K. Hayashi, Waipahu, HI (US); Carlos M. Torres, Jr., San Diego, CA (US); Richard C. Ordonez, Mililani, HI (US); Nackieb M. Kamin, Kapolei, HI (US); David Garmire, Ann Arbor, MI (US)

(73) Assignee: United States of America, as represented by the Secretary of the Navy, Washington, DC (US)

( * ) Notice: Subject to any disclaimer, the term of this patent is extended or adjusted under 35 U.S.C. 154(b) by 828 days.

(21) Appl. No.: 17/499,747

(22) Filed: Oct. 12, 2021

(65) Prior Publication Data
US 2023/0111275 A1   Apr. 13, 2023

(51) Int. Cl.
*H10F 77/14* (2025.01)
*H03F 3/08* (2006.01)
(Continued)

(52) U.S. Cl.
CPC ........... *H10F 77/1433* (2025.01); *H03F 3/08* (2013.01); *H03F 3/45071* (2013.01);
(Continued)

(58) Field of Classification Search
CPC ........ H01L 31/035218; H01L 31/1129; H01L 31/111; H01L 31/1013; H03F 3/08; H03F 3/45071
See application file for complete search history.

(56) References Cited

U.S. PATENT DOCUMENTS 3,845,404 A * 10/1974 Trilling ............... H03F 3/45479
330/69
6,456,422 B1 * 9/2002 Hayes .................. H04B 10/675
359/325

(Continued)

OTHER PUBLICATIONS

Konstantatos, Gerasimos, et al. "Hybrid Graphene-Quantum Dot Phototransistors with Ultrahigh Gain." Nature Nanotechnology, vol. 7, No. 6, 2012, pp. 363-368.

(Continued)

*Primary Examiner* — Jennifer D Bennett
(74) *Attorney, Agent, or Firm* — Naval Information Warfare Center Pacific; Kyle Eppele; Paul C. Oestreich (57) ABSTRACT

A differential amplifier includes an unmatched pair, including first quantum dots and second quantum dots, and a matched pair, including first and second phototransistors. The unmatched pair has a difference between a first spectrum absorbed by the first quantum dots and a second spectrum absorbed by the second quantum dots. Each of the first and second phototransistors includes a channel. The first quantum dots absorb the first spectrum from incident electromagnetic radiation and gate a first current through the channel of the first phototransistor, and the second quantum dots absorb the second spectrum from the incident electromagnetic radiation and gate a second current through the channel of the second phototransistor. The first and second phototransistors are coupled together for generating a differential output from the first and second currents, the differential output corresponding to the difference between the first and second spectrums within the incident electromagnetic radiation.

23 Claims, 5 Drawing Sheets

(51) Int. Cl.
*H03F 3/45* (2006.01)
*H10F 30/21* (2025.01)
*H10F 30/26* (2025.01)
*H10F 30/28* (2025.01)

(52) U.S. Cl.
CPC ......... *H10F 30/26* (2025.01); *H10F 30/2877* (2025.01); *H10F 30/288* (2025.01)

(56) References Cited

U.S. PATENT DOCUMENTS

| | | | |
|---|---|---|---|
| 6,624,850 | B1 | 9/2003 | Guidash |
| 7,026,641 | B2 | 4/2006 | Mohseni |
| 9,030,189 | B2 | 5/2015 | Sargent |
| 9,331,293 | B2 | 5/2016 | Huang |
| 2003/0218175 | A1* | 11/2003 | Ogawa .............. H01L 31/02327 257/E31.128 |
| 2008/0054391 | A1* | 3/2008 | Apsel ........................ H03F 3/50 257/E27.122 |
| 2019/0103502 | A1* | 4/2019 | Futatsugi .......... H01L 31/02019 |
| 2019/0221686 | A1* | 7/2019 | Allen .................. H01L 27/1443 |

OTHER PUBLICATIONS

Nikitskiy, Ivan, et al. "Integrating an Electrically Active Colloidal Quantum Dot Photodiode with a Graphene Phototransistor." Nature Communications, vol. 7, 2016, pp. 11954.

Ho, Derek, et al. "CMOS Tunable-Wavelength Multi-Color Photogate Sensor." IEEE Transactions on Biomedical Circuits and Systems, vol. 7, No. 6, 2013, pp. 805-819.

Park, KyoungWon, et al. "Single Molecule Quantum-Confined Stark Effect Measurements of Semiconductor Nanoparticles at Room Temperature." ACS Nano, vol. 6, No. 11, 2012, pp. 10013-10023.

* cited by examiner

DIFFERENTIAL AMPLIFIER GATED WITH QUANTUM DOTS ABSORBING INCIDENT ELECTROMAGNETIC RADIATION

FEDERALLY-SPONSORED RESEARCH AND DEVELOPMENT

The United States Government has ownership rights in this invention. Licensing and technical inquiries may be directed to the Office of Research and Technical Applications, Naval Information Warfare Center Pacific, Code 72120, San Diego, CA, 92152; voice (619) 553-5118; ssc_pac_t2@navy.mil. Reference Navy Case Number 109018.

BACKGROUND OF THE INVENTION

Quantum dots have high quantum yield in generating electron-hole pairs upon absorbing visible and infrared photons. Although quantum dots have narrow emission bands with a full width at half maximum (FWHM) as low as 25 nm and with a wavelength readily adjusted by adjusting the size and/or chemistry of the quantum dots, quantum dots do not have corresponding narrow absorption bands due to a Stokes shift. Instead due to a Stokes shift, quantum dots absorb all wavelengths shorter than their emission wavelength.

Quantum dots can be considered a high-pass photoelectric device because visible and infrared photons with energies higher than (and wavelengths shorter than) the quantum dot's narrow emission band are absorbed and converted into electron-hole pairs. This enables a variety of broadband applications, but it does not provide the spectral resolution and/or spectral selectivity required for various commercial and military applications such as spectrographic analysis and color and hyperspectral imaging.

SUMMARY

A differential amplifier includes an unmatched pair, including first quantum dots and second quantum dots, and a matched pair, including first and second phototransistors. The unmatched pair has a difference between a first spectrum absorbed by the first quantum dots and a second spectrum absorbed by the second quantum dots. Each of the first and second phototransistors includes a channel. The first quantum dots absorb the first spectrum from incident electromagnetic radiation and gate a first current through the channel of the first phototransistor, and the second quantum dots absorb the second spectrum from the incident electromagnetic radiation and gate a second current through the channel of the second phototransistor. The first and second phototransistors are coupled together for generating a differential output from the first and second currents, the differential output corresponding to the difference between the first and second spectrums within the incident electromagnetic radiation.

BRIEF DESCRIPTION OF THE DRAWINGS

Throughout the several views, like elements are referenced using like references. The elements in the figures are not drawn to scale and some dimensions are exaggerated for clarity.

DETAILED DESCRIPTION OF EMBODIMENTS

The disclosed systems below may be described generally, as well as in terms of specific examples and/or specific embodiments. For instances where references are made to detailed examples and/or embodiments, it should be appreciated that any of the underlying principles described are not to be limited to a single embodiment, but may be expanded for use with any of the other methods and systems described herein as will be understood by one of ordinary skill in the art unless otherwise stated specifically.

Despite quantum dots having broadband absorption of all wavelengths shorter than a cutoff wavelength set by factors including the size and/or chemistry of the quantum dots, embodiments of the invention detect narrow absorption bands. In an example application, an electromagnetic spectrum analyzer or optical spectrometer detects the respective amplitude for a few or many narrow wavelength bands within incident electromagnetic radiation. In another example application, a photodetector detects a telecommunication modulation of incident electromagnetic radiation, or captures color or hyperspectral images from incident electromagnetic radiation.

Figure 1:
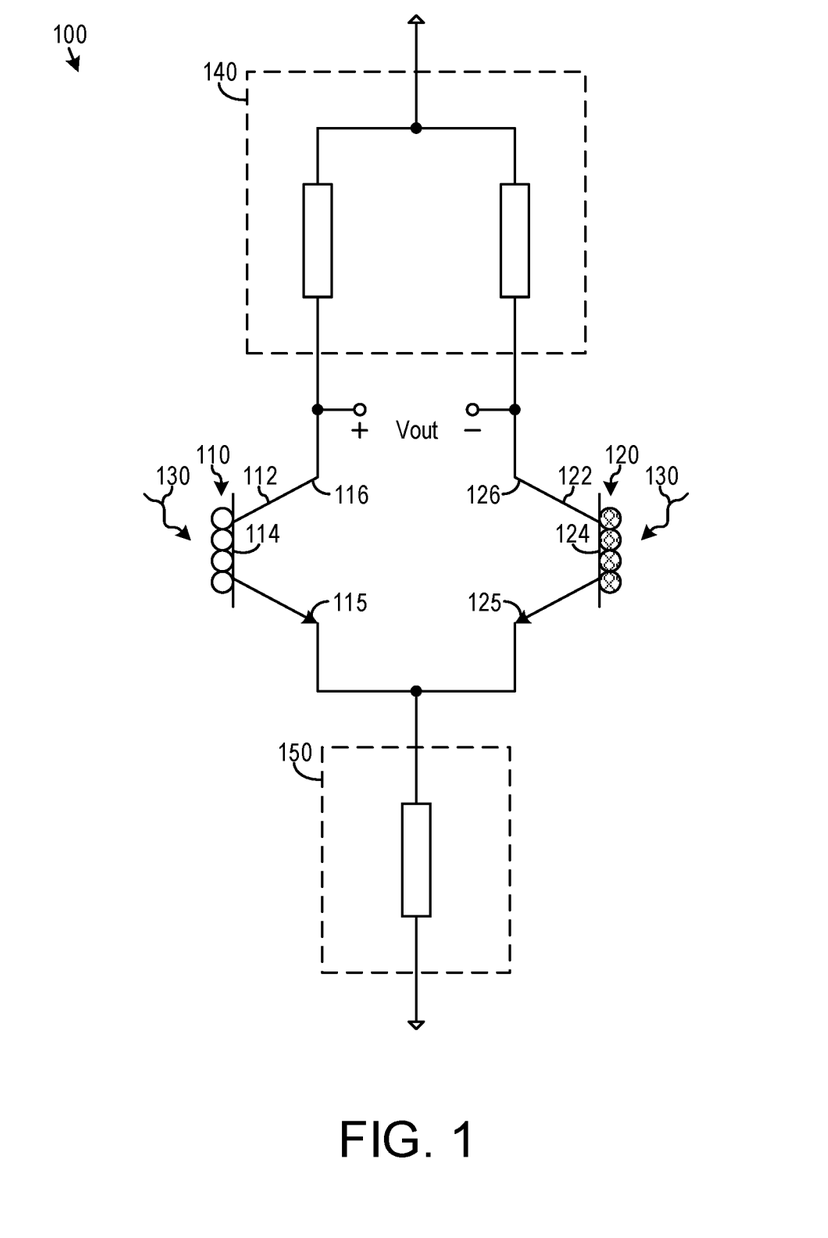
FIG. 1 is a circuit diagram of a differential amplifier gated with quantum dots for absorbing an incident electromagnetic radiation in accordance with an embodiment of the invention.

FIG. 1 is a circuit diagram of a differential amplifier 100 gated with quantum dots 110 and 120 for absorbing an incident electromagnetic radiation 130 in accordance with an embodiment of the invention.

The differential amplifier 100 includes an unmatched pair of the first quantum dots 110 and the second quantum dots 120. The first quantum dots 110 and the second quantum dots 120 are unmatched due to differing size/shape geometry and/or differing material compositions, and/or other differences discussed below. This difference, which makes the first and second quantum dots 110 and 120 unmatched, is indicated in FIG. 1 with the unshaded first quantum dots 110 and the shaded second quantum dots 120.

Figure 2A:
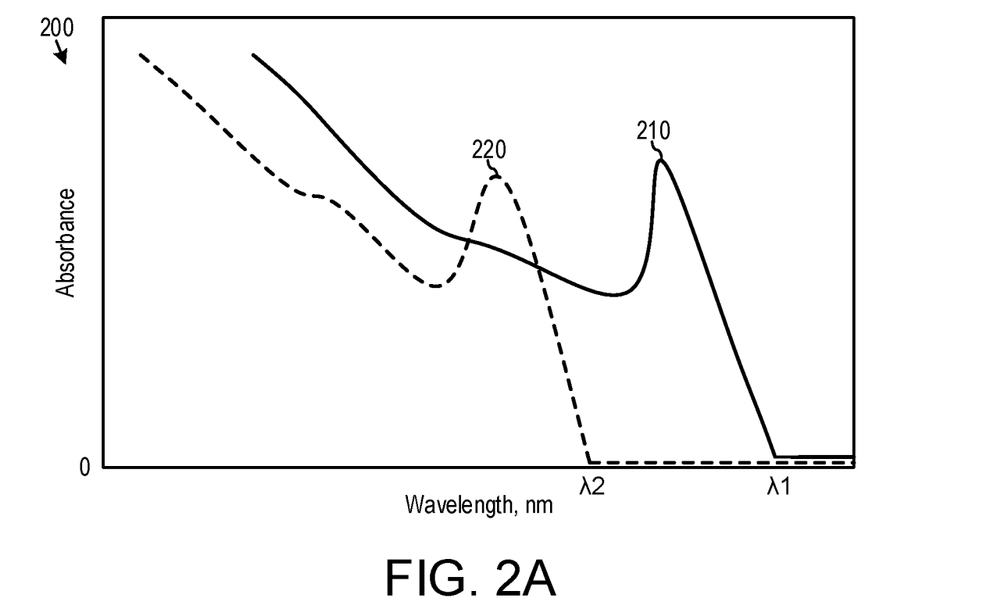
FIG. 2A is a plot of a first spectrum absorbed by first quantum dots and a second spectrum absorbed by second quantum dots of the differential amplifier of FIG. 1 in accordance with an embodiment of the invention.

Referring to FIG. 2A, the first quantum dots 110 absorb a first spectrum 210 and the second quantum dots 120 absorb a second spectrum 220 due to this difference in geometry, materials, etc. The first spectrum 210 absorbed by the first quantum dots 110 and the second spectrum 220 absorbed by the second quantum dots 120 are different due to this difference in geometry, materials, etc.

In one embodiment, the first and second quantum dots 110 and 120 are all composed of a same material or the same materials, but a size and/or a shape of a geometry the first quantum dots 110 differs from a size and/or a shape of a geometry of the second quantum dots 120, so that the first quantum dots 110 absorb the first spectrum 210 and the second quantum dots 120 absorb the second spectrum 220 with the difference between the first and second spectrums.

The differential amplifier 100 further includes a matched pair of a first phototransistor 112 and second phototransistor 122. The first phototransistor 112 has a channel 114, and the second phototransistor 122 has a channel 124. The first quantum dots 110 absorb the first spectrum 210 from the incident electromagnetic radiation 130 and gate a first current through the channel 114 of the first phototransistor 112. Similarly, the second quantum dots 120 absorb the second spectrum 220 from the incident electromagnetic radiation 130 and gate a second current through the channel 124 of the second phototransistor 122. The first current through the channel 114 of the first phototransistor 112 depends upon a magnitude of the first spectrum 210 within the incident electromagnetic radiation 130. Similarly, the second current through the channel 124 of the second phototransistor 122 depends upon a magnitude of the second spectrum 220 within the incident electromagnetic radiation 130.

The first and second phototransistors 112 and 122 are coupled together at their respective emitters/sources 115 and 125. From Kirchhoff's loop rule, the voltage Vout at the differential output is a difference between a voltage across the first phototransistor 112 from its collector/drain 116 to its emitter/source 115, and a voltage across the second phototransistor 122 from its collector/drain 126 to its emitter/source 125. When the first and second phototransistors 112 and 122 operate linearly, the voltage Vout at the differential output corresponds to the difference between the first and second spectrums 210 and 220 within the incident electromagnetic radiation 130. Typically, the differential load 140 and the current source 150 ensure the first and second phototransistors 112 and 122 operate linearly.

The differential load 140 is coupled to the collector/drain 116 of the first phototransistor 112 and the collector/drain 126 the second phototransistor 122 for generating the differential output of voltage Vout from the first current through the collector/drain 116 of the first phototransistor 112 and the second current through the collector/drain 126 the second phototransistor 122. The differential output is generated between collector/drain 116 of the first phototransistor 112 and the collector/drain 126 the second phototransistor 122.

The current source 150 is coupled to both the emitter/source 115 of the first phototransistor 112 and the emitter/source 125 of the second phototransistor 122 for conveying a sum, from Kirchhoff's current rule, of the first current through the emitter/source 115 of the first phototransistor 112 and the second current through the emitter/source 125 of the second phototransistor 122.

FIG. 2A is a plot 200 of a first spectrum 210 absorbed by first quantum dots 110 and a second spectrum 220 absorbed by second quantum dots 120 of the differential amplifier 100 of FIG. 1 in accordance with an embodiment of the invention. The first spectrum 210 absorbed by the first quantum dots 110 and the second spectrum 220 absorbed by the second quantum dots 120 are different due to differences in geometry, materials, etc. between the first and second quantum dots 110 and 120. The first quantum dots 110 of the unmatched pair absorb the first spectrum 210 consisting of wavelengths shorter than a first cutoff wavelength $\lambda 1$, and the second quantum dots 120 of the unmatched pair absorb the second spectrum 220 consisting of wavelengths shorter than a second cutoff wavelength $\lambda 2$.

Typically, an electron confined within one of the first quantum dots 110 has a ground energy state, and one or more excited states for the electron still confined within this first quantum dot. The size/shape geometry and the material composition of each of the first quantum dots 110 plus external influences, such as an applied electric field, determine the energy levels of the ground and excited states. For example, when the material composition is a semiconductor, the bandgap of the semiconductor specifies a base excited state, but confinement within the first quantum dots 110 alters and quantizes the available excited states into discrete energy levels. Typically, the first quantum dots 110 absorb a photon having the cutoff wavelength $\lambda 1$ when an electron transitions from the ground state to the first available excited state, creating an electron-hole pair. A photon with a wavelength longer than the cutoff wavelength $\lambda 1$ cannot be absorbed by an electron in the ground state because the photon has insufficient energy to transition the electron from the ground state to the first available excited state. Thus, absorbance in the first spectrum 210 of the first quantum dots 110 goes to zero for wavelengths greater than the cutoff wavelength $\lambda 1$. Due to Stokes shift, all wavelengths shorter than the cutoff wavelength $\lambda 1$ exhibit some absorbance even when there is no matching transition among the quantized energy levels.

Similarly, the second quantum dots 120 absorb photons in the second spectrum 220 with a wavelength shorter than the second cutoff wavelength $\lambda 2$, which differs from the first cutoff wavelength $\lambda 1$ due to differences in geometry, materials, etc. between the first and second quantum dots 110 and 120.

Figure 2B:
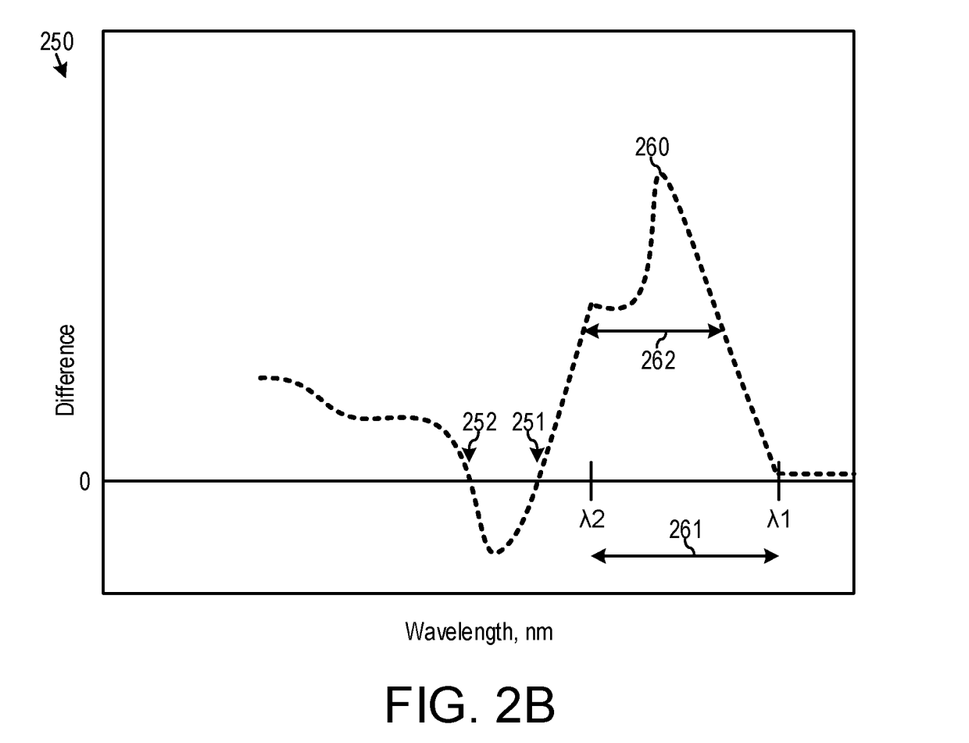
FIG. 2B is a plot of a difference between the first spectrum absorbed by the first quantum dots and the second spectrum absorbed by the second quantum dots of FIG. 2A.

FIG. 2B is a plot 250 of a difference 260 between the first spectrum 210 absorbed by the first quantum dots 110 and the second spectrum 220 absorbed by the second quantum dots 120 of FIG. 2A. At each wavelength, the difference 260 is the absorbance of the first spectrum 210 for that wavelength minus the absorbance of the second spectrum 220 for that wavelength. For example, at wavelengths 251 and 252 the spectrums 210 and 220 crossover in FIG. 2A with the same absorbance, such that their difference is zero in FIG. 2B. The difference 260 is also zero for all wavelengths longer than the first cutoff wavelength $\lambda 1$ because the first and second spectrums 210 and 220 both have no absorbance for these wavelengths.

Typically, an electron-hole pair is created when the first quantum dots 110 absorb a photon in the first spectrum 210. The first phototransistor 112 is arranged so that the electron of the electron-hole pair preferably injects into the channel 114 while the hole of the electron-hole pair remains in the first quantum dots 110, or vice versa with holes injected and electrons staying behind. The magnitude of injecting charge carriers into the channel 114 depends upon the amplitude of the first spectrum 210 within the incident electromagnetic radiation 130. Hence, the first quantum dots 110 gate a first current through the channel 114 of the first phototransistor 112, and this first current depends upon the amplitude of the first spectrum 210 within the incident electromagnetic radiation 130. Similarly, the second quantum dots 120 gate a second current through the channel 124 of the second phototransistor 122, and this second current depends upon the amplitude of the second spectrum 220 within the incident electromagnetic radiation 130.

The differential amplifier 100 generates its differential output from the first current through the channel 114 of the first phototransistor 112 and the second current through the channel 124 of the second phototransistor 122. The differential output of the differential amplifier 100 is a differential voltage Vout typically proportional to the difference obtained from subtracting the second spectrum 220 within the incident electromagnetic radiation 130 from the first spectrum 210 within the incident electromagnetic radiation 130. Therefore, the differential voltage Vout from the differential amplifier 100 is proportional to the difference 260 shown in FIG. 2B.

For example, when the incident electromagnetic radiation 130 includes a single wavelength between cutoff wavelengths $\lambda 1$ and $\lambda 2$, the differential voltage Vout from the differential amplifier 100 is a strong positive voltage. When the incident electromagnetic radiation 130 includes a single wavelength between wavelengths 251 and 252, the differential voltage Vout from the differential amplifier 100 is a weak negative voltage. In general, the differential voltage Vout from the differential amplifier 100 covers principally a passband 261 with a first cutoff wavelength $\lambda 1$ at an upper edge of a passband 261 and a second cutoff wavelength $\lambda 2$ at a lower edge of the passband 261. Alternatively, the differential amplifier 100 has a full width at half maximum (FWHM) passband 262. Thus, the differential output voltage Vout from the differential amplifier 100 predominately corresponds to an amplitude of wavelengths of the incident electromagnetic radiation 130 within the passband 261 or 262.

In summary, the first quantum dots 110 of the unmatched pair absorb the first spectrum 210 consisting of wavelengths shorter than a first cutoff wavelength $\lambda 1$ at an upper edge of the passband 261 or 262, and the second quantum dots 120 of the unmatched pair absorb the second spectrum 220 consisting of wavelengths shorter than a second cutoff wavelength $\lambda 2$ at a lower edge of the passband 261 or 262, such that the differential output of voltage Vout predominately corresponds to an amplitude of the incident electromagnetic radiation 130 within the passband 261 or 262.

Example applications include an electromagnetic spectrum analyzer and a photodetector for detecting amplitude modulation. For the former application, the differential amplifier 100 is an electromagnetic spectrum analyzer that generates the differential output predominately corresponding to an amplitude of wavelengths of the incident electromagnetic radiation 130 within the passband 261 or 262. For the latter application, the differential amplifier 100 is a photodetector that receives an amplitude modulation within the amplitude modulation band of the passband 261 or 262, and generates the differential output that predominately corresponds to the amplitude modulation of the incident electromagnetic radiation 130.

An advantage of the differential amplifier 100 is an excellent common mode rejection. For example, the incident electromagnetic radiation 130 includes an amplitude modulation within the passband 261 or 262, but the incident electromagnetic radiation 130 also includes strong sunlight that overwhelms the amplitude modulation. However, the sunlight produces nearly equal effects on the two phototransistors 112 and 122, such that the differential output of voltage Vout cancels the equal effects of the sunlight, and the differential output predominately corresponds to the amplitude modulation of the incident electromagnetic radiation 130.

Figure 3:
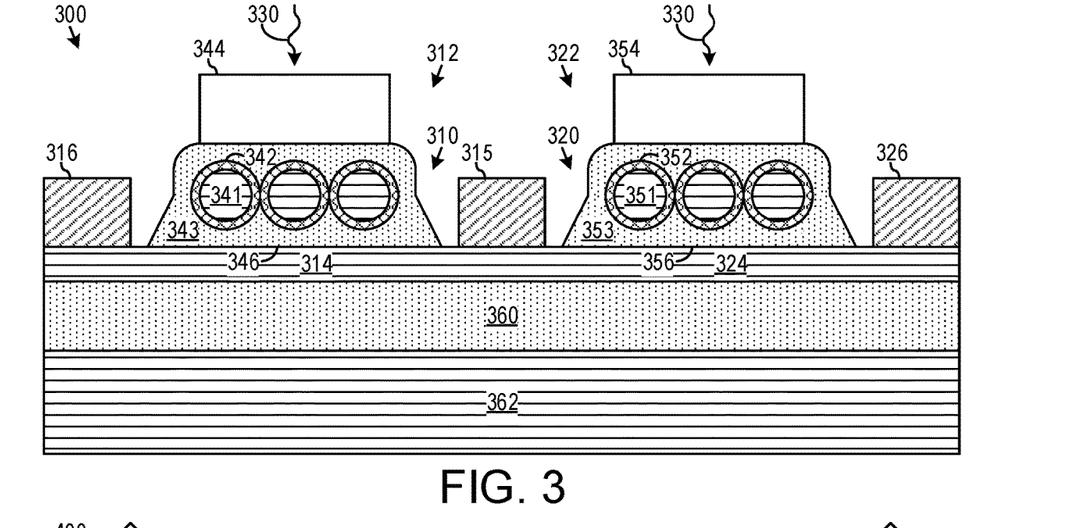
FIG. 3 is a cross-section through a differential amplifier gated with quantum dots for absorbing an incident electromagnetic radiation in accordance with an embodiment of the invention.

FIG. 3 is a cross-section through a differential amplifier 300 gated with quantum dots 310 and 320 for absorbing an incident electromagnetic radiation 330 in accordance with an embodiment of the invention.

The unmatched pair includes the first quantum dots 310 and the second quantum dots 320. The first quantum dots 310 each have a core 341, an optional shell 342, and a surface passivation 343, and the second quantum dots 320 each have a core 351, an optional shell 352, and a surface passivation 353.

In one embodiment, the first and second quantum dots 310 and 320 all have a same size and a same shape for each of the cores 341 and 351, the optional shells 342 and 352, and the surface passivations 343 and 353 of a shared geometry of the first and second quantum dots 310 and 320, but a material composing a particular one of the core 341, the shell 342, or the surface passivation 343 for the first quantum dots 310 differs from a material composing the particular one for the second quantum dots 320, so that the first quantum dots 310 absorb the first spectrum 210 and the second quantum dots 320 absorb the second spectrum 220 with the difference between the first and second spectrums 210 and 220.

For example, the first and second quantum dots 310 and 320 are identical except that a ligand is used for the surface passivations 343 and 353, with the ligand having a polymer backbone supporting the same functional groups, but with a molecular weight varying between the surface passivations 343 and 353 because they include different numbers of polymer units in their respective polymer backbones. Due to this difference between the first and second quantum dots 310 and 320, they absorb different spectrums 210 and 220.

The unmatched pair further includes a first top gate 344 and a second top gate 354. The top gates 344 and 354 are transparent to appropriate wavelengths of the incident electromagnetic radiation 330. For example, the top gates 344 and 354 are indium tin oxide or graphene. The first top gate 344 is disposed on the first quantum dots 310 opposite a first heterojunction 346 between the first quantum dots 310 and the channel 314 of the first phototransistor 312. The first top gate 344 applies a first bias voltage generating an electric field through the first quantum dots 310 to the channel 314 of the first phototransistor 312. The second top gate 354 is disposed on the second quantum dots 320 opposite a second heterojunction 356 between the second quantum dots 320 and the channel 324 of the second phototransistor 322. The second top gate 354 applies a second bias voltage generating an electric field through the second quantum dots 320 to the channel 324 of the second phototransistor 322.

The first bias voltage from the first top gate 344 regulates charge carriers transferring across the first heterojunction 346 and adjusts a Fermi energy level and a transconductance of the channel 314 of the first phototransistor 312. The second bias voltage from the second top gate 354 regulates charge carriers transferring across the second heterojunction 356 and adjusts a Fermi energy level and a transconductance of the channel 324 of the second phototransistor 322.

In one embodiment, the first and second quantum dots 310 and 320 included in the unmatched pair are themselves matched to all have a same material, a same size, and a same shape for each of the cores 341 and 351, the optional shells 342 and 352, and the surface passivations 343 and 353 of a shared geometry of the first and second quantum dots 310 and 320, but the first and second bias voltages are arranged to differ between the top gates 344 and 354, so that the first quantum dots 310 absorb the first spectrum 210 and the second quantum dots 320 absorb the second spectrum 220 with the difference between the spectrums 210 and 220.

The first phototransistor 312 includes the channel 314, a base/gate that includes the first heterojunction 346, a collector/drain 316, and an emitter/source 315. The channel 314 guides the first current between the collector/drain 316 and the emitter/source 315. The base/gate includes the first heterojunction 346 for transferring charge carriers that gate the first current through the channel 314 of the first phototransistor 312 when the first quantum dots 310 absorb the first spectrum 210 within the incident electromagnetic radiation 330. The collector/drain 316 generates a positive output terminal of the differential output between the positive output terminal and a negative output terminal. The emitter/source 315 of the first phototransistor 312 is shared with and couples together with an emitter/source of the second phototransistor 322.

Similarly, the second phototransistor 322 includes the channel 324, a base/gate that includes the second heterojunction 356, a collector/drain 326, and the shared emitter/source 315. The channel 324 guides the second current between the collector/drain 326 and the shared emitter/source 315. The base/gate includes the second heterojunction 356 for transferring charge carriers that gate the second current through the channel 324 of the second phototransistor 322 when the second quantum dots 320 absorb the second spectrum 220 within the incident electromagnetic radiation 330. The collector/drain 326 generates the negative output terminal of the differential output.

In one embodiment, the first and second phototransistors 312 and 322 are fabricated adjacent to each other in an integrated circuit with matched fabrication steps producing the matched pair of the first and second phototransistors 312 and 322, but the first quantum dots 310 and the second quantum dots 320 are subsequently fabricated at the matched pair in the integrated circuit with unmatched fabrication steps producing the unmatched pair including the first and second quantum dots 310 and 320.

In a preferred embodiment, the channels 314 and 324 of the first and second phototransistors 312 and 322 are composed of graphene. Generally, the channels 314 and 324 are composed of a two-dimensional nanomaterial, a semiconductor, and/or a semi-metal. Example two-dimensional nanomaterials include molecules of graphene, $MoS_2$, $MoSe_2$, $WS_2$, and $WSe_2$. A semi-metal is preferred over a semiconductor because semi-metals have higher mobility for charge carriers and consequently higher transconductance. A two-dimensional nanomaterial is preferred because two-dimensional nanomaterials have no bulk screening effects to enable very high photosensitivity. Thus, graphene is especially preference because graphene is both a two-dimensional nanomaterial and a semi-metal. The two-dimensional nanomaterial, a semiconductor, and/or a semi-metal of the channels 314 and 324 is grown or deposited on an insulator 360, such as silicon dioxide, which is grown or deposited on a substrate 362, such as highly doped silicon.

In one embodiment, the matched pair includes the highly doped substrate 362 as a back gate shared by the first and second phototransistors 312 and 322. The back gate further adjusts a shared Fermi energy level and a shared transconductance of the channel 314 of the first phototransistor 312 and the channel 324 of the second phototransistor 322.

The first and second phototransistors 312 and 322 have certain characteristics of both bipolar and field effect transistors. The injection of charge carriers of one polarity across the heterojunctions 346 and 356 is similar to a bipolar transistor. However, these injected charge carriers are swept by bias voltages between the collector/drains 316 and 326 and the shared emitter/source 315 with potential voltage gain, but no current gain. Because the injected charge carriers leave behind the opposite polarity on the top gates 344 and 354, the top gates 344 and 354 apply an electric field to the channels 314 and 324 similar to a field effect transistor, potentially providing current gain. Although the selected materials and voltage and current biases emphasize either bipolar or field effect characteristics, preferably the materials and voltage and current biases are selected to balance the bipolar and field effect characteristics. For example, when dynamic incident electromagnetic radiation 330 decreases in intensity, the residual charge at top gates 344 and 354 is neutralized by recombination with reverse transfer across the heterojunctions 346 and 356 of the injected charge carriers. Thus, extreme emphasis of field effect characteristics to obtain high power gain would impair dynamic performance.

Figure 4:
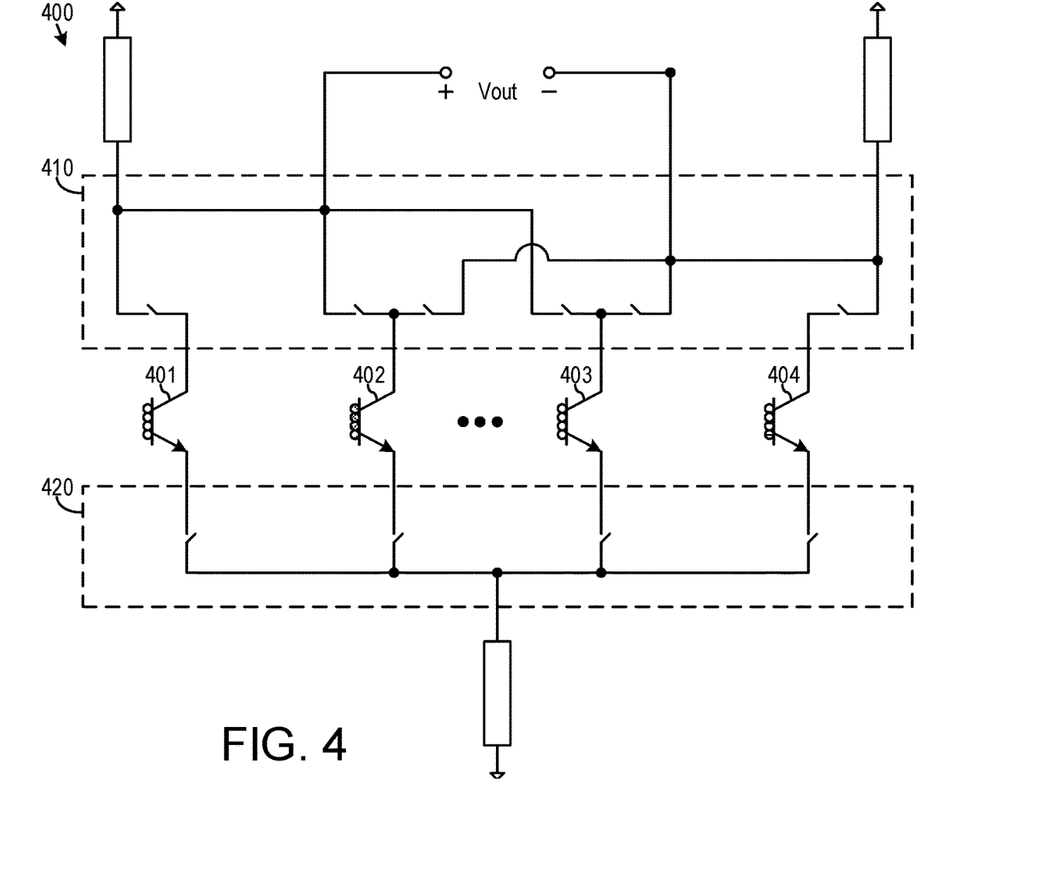
FIG. 4 is a circuit diagram of a differential amplifier with an array of transistors gated with quantum dots for absorbing an incident electromagnetic radiation in accordance with an embodiment of the invention.

FIG. 4 is a circuit diagram of a differential amplifier 400 with an array of transistors 401 and 402 through 403 and 404 gated with respective quantum dots for absorbing an incident electromagnetic radiation in accordance with an embodiment of the invention. The transistor array includes the first transistor 401, the second transistor 402 through the penultimate transistor 403, and a last transistor 404 in a pool sequence. Each of the first 401, second 402 through penultimate 403, and last 404 transistors is gated with respective quantum dots. Typically, the respective quantum dots absorb spectrums with successively shorter cutoff wavelengths in the visible or infrared.

An analog multiplexer 410 connects a first selected one of the first 401 and second 402 transistors through the penultimate 403 transistor in the pool sequence into the differential amplifier 400 as the first phototransistor 112 gated with the first quantum dots 110 that are the respective quantum dots of the first selected transistor, and the analog multiplexer 410 connects a second selected one of the second 402 transistor through the penultimate 403 and last 404 transistors in the pool sequence into the differential amplifier 400 as the second phototransistor 122 gated with the second quantum dots 120 that are the respective quantum dots of the second selected transistor.

An optional analog multiplexer 420 further connects the first and second selected transistors into the differential amplifier 400 as the first and second phototransistors 112 and 122. All the switches are effectively closed when the optional analog multiplexer 420 is omitted. Alternatively, the optional analog multiplexer 420 includes additional switches that ground all of the unselected transistors in the pool sequence.

Typically, the first and second selected transistors are adjacent ones in the pool sequence with first and second cutoff wavelengths $\lambda 1$ and $\lambda 2$, such that the differential output from the differential amplifier 400 encompasses a passband 261 with an upper edge at the first cutoff wavelength $\lambda 1$ of the first selected transistor and a lower edge at the second cutoff wavelength $\lambda 2$ of the second selected transistor. However, in the example application of an electromagnetic spectrum analyzer, a coarse spectrum analysis measures the amplitude of wide passbands from selecting non-adjacent transistors in the pool sequence, and then a fine spectrum analysis measures the amplitude of narrow passbands from selecting adjacent transistors in the pool sequence, but only within those wide passbands with a measured significant amplitude from the coarse spectrum analysis.

Figure 5A:
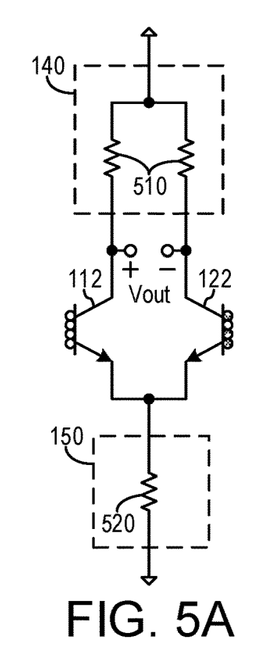
FIG. 5A-C are circuit diagrams illustrating a differential load and a current source of a differential amplifier gated with quantum dots for absorbing an incident electromagnetic radiation in accordance with an embodiment of the invention.
Figure 5B:
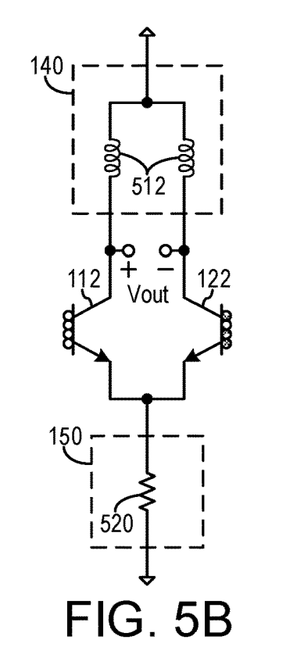
Figure 5C:
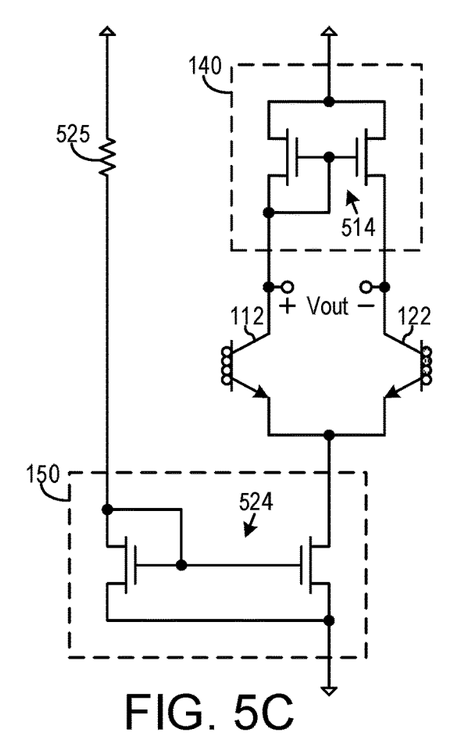

FIG. 5A-C are circuit diagrams illustrating a differential load 140 and a current source 150 of a differential amplifier gated with quantum dots for absorbing an incident electromagnetic radiation in accordance with an embodiment of the invention.

The differential load 140 is a pair of resistors 510 both coupled to a first terminal of a power supply and respectively coupled to the collector/drain of the first and second phototransistors 112 and 122, a pair of inductors 512 both coupled to the first terminal and respectively coupled to the collector/drain of the first and second phototransistors 112 and 122, or a current mirror 514 that from the first terminal provides and equalizes the first current through the collector/drain of the first phototransistor 112 and the second current through the collector/drain of the second phototransistor 122.

The current source 150 is a resistor 520 coupled between a second terminal of the power supply and the emitter/source of both the first and second phototransistors 112 and 122, or a current mirror 524 coupled to the second terminal and reflecting a reference current as the sum of the first current through the emitter/source of the first phototransistor 112 and the second current through the emitter/source of the second phototransistor 122. A resistor 525 sets the reference current of the current mirror 524.

In other embodiments, the various implementations of the differential load 140 and the current source 150 are mixed and matched in combinations not shown in FIG. 5A-C.

Figure 6:
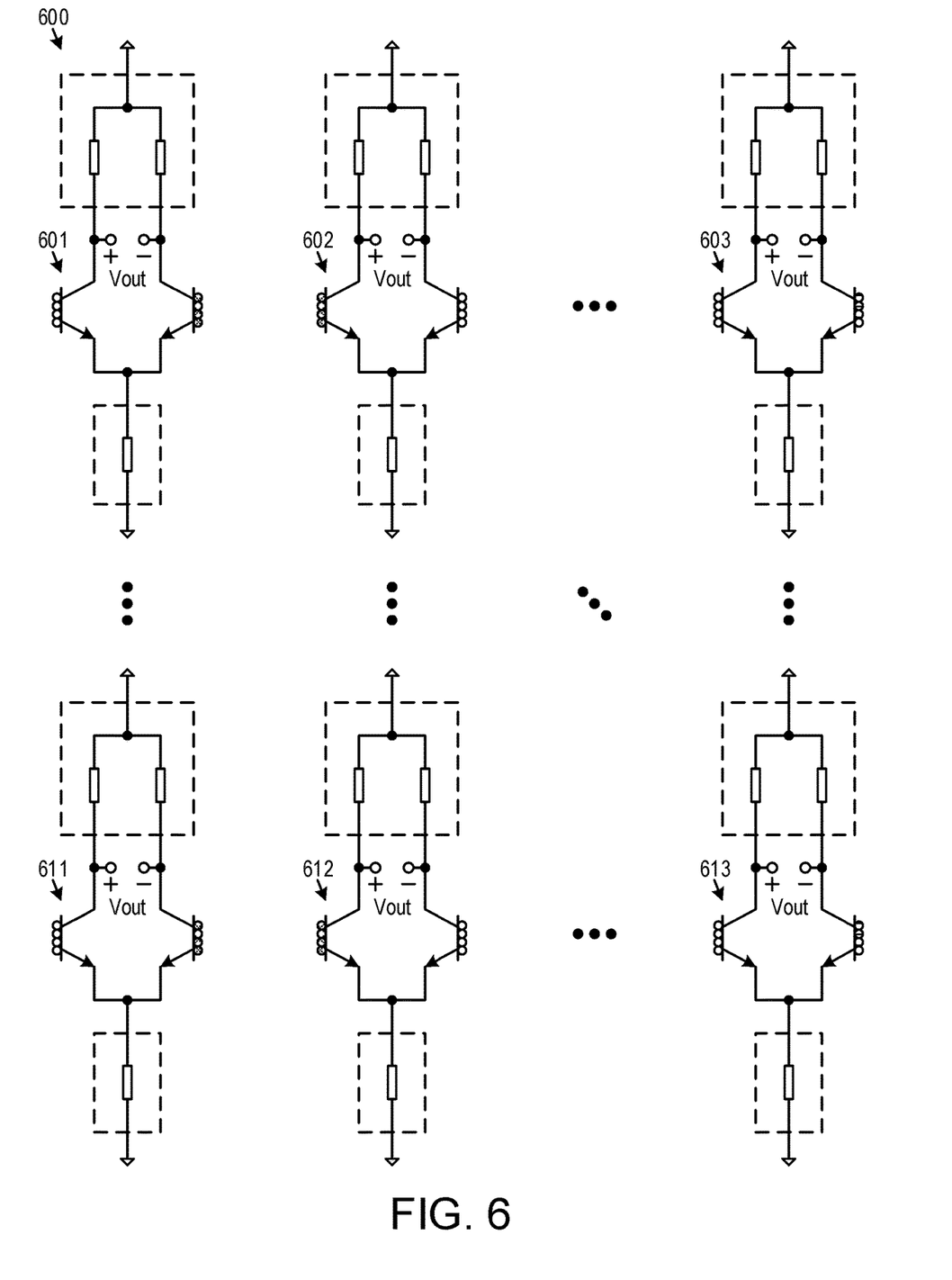
FIG. 6 is a circuit diagram of an array of differential amplifiers gated with quantum dots for absorbing an incident electromagnetic radiation in accordance with an embodiment of the invention.

FIG. 6 is a circuit diagram of an array 600 of differential amplifiers gated with quantum dots for absorbing an incident electromagnetic radiation in accordance with an embodiment of the invention. The array 600 is either a two-dimensional array or a linear array limited to only one row or only one column.

In one embodiment, the array 600 is a linear array with two instances 601 and 602 of the differential amplifier 100 of FIG. 1. The instances 601 and 602 of the differential amplifier have a corresponding sequence of a first, second, and third spectrum respectively having a first, second, and third cutoff wavelength that are successively shorter. The quantum dots of the first instance 601 absorb the first spectrum consisting of wavelengths shorter than the first cutoff wavelength. The second quantum dots of the first instance 601 and the first quantum dots of the second instance 602 both absorb the second spectrum consisting of wavelengths shorter than the second cutoff wavelength. The second quantum dots of the second instance 602 absorb the third spectrum consisting of wavelengths shorter than the third cutoff wavelength.

Thus, the differential output of the first instance 601 predominately corresponds to an amplitude of wavelengths of the incident electromagnetic radiation within a first band having an upper edge at the first cutoff wavelength and a lower edge at the shorter second cutoff wavelength, and the differential output of the second instance 602 predominately corresponds to an amplitude of wavelengths of the incident electromagnetic radiation within a second band having an upper edge at the second cutoff wavelength and a lower edge at the shorter third cutoff wavelength.

Example applications include an electromagnetic spectrum analyzer detecting the amplitude within the incident electromagnetic radiation of wavelengths in the first and second frequency bands, and a photodetector for detecting frequency modulation or a combination of amplitude and frequency modulation.

In an embodiment of a photodetector, the incident electromagnetic radiation has binary frequency modulation between a first wavelength within the first band and a second wavelength within the second band. A comparison of the differential output of the first instance and the differential output of the second instance corresponds to a decoding of the binary frequency modulation.

In another embodiment of a photodetector, the incident electromagnetic radiation has an amplitude and frequency modulation including binary frequency modulation between a first wavelength within the first band and a second wavelength within the second band, and including binary on/off amplitude modulation of each of the first and second wavelengths of the binary frequency modulation. A combination of the differential output of the first instance and the differential output of the second instance corresponds to a decoding of the amplitude and frequency modulation.

In an embodiment of an electromagnetic spectrum analyzer, the array 600 includes a sequence of instances 601 and 602 through 603 of the differential amplifier 100 of FIG. 1 indexed from 1 to N and having a corresponding sequence of spectrums indexed from 1 to N+1. For each instance with index k from 1 to N in the sequence of instances, the first quantum dots of the instance of the differential amplifier absorb the spectrum with index k in the sequence of spectrums, and the second quantum dots of the instance of the differential amplifier absorb the spectrum with index k+1 in the sequence of spectrums.

Typically, the sequence of spectrums indexed from 1 to N+1 has a corresponding sequence of successively shorter cutoff wavelengths indexed from 1 to N+1, and each spectrum with index k from 1 to N+1 in the sequence of spectrums consists of wavelengths shorter than the cutoff wavelength k in the sequence of cutoff wavelengths. Thus, the differential output of the instance of the differential amplifier with index k from 1 to N predominately corresponds to an amplitude of wavelengths of the incident electromagnetic radiation within a passband having an upper edge at the cutoff wavelength with index k and a lower edge at the shorter cutoff wavelength with index k+1. In an example optical spectrometer with color discrimination slightly better than the human eye, N=4 instances 601 and 602 through 603 and the sequence of spectrums indexed from 1 to 5 consists of wavelengths shorter than the cutoff wavelengths 650 nm, 600 nm, 550 nm, 500 nm, and 450 nm, respectively.

In one embodiment of a photodetector, the photodetector includes an array 600 of instances 601 and 602 through 603 through 611 and 612 through 613 of imaging pixels, each including the instance of the differential amplifier 100 of FIG. 1. For the instance within each of the pixels, the first quantum dots of the unmatched pair absorb the first spectrum consisting of wavelengths shorter than an adjustable first cutoff wavelength at an upper edge of an adjustable passband, and the second quantum dots of the unmatched pair absorb the second spectrum consisting of wavelengths shorter than an adjustable second cutoff wavelength at a lower edge of the adjustable passband. For example, the first top gate 344 of FIG. 3 adjusts the first cutoff wavelength at an upper edge of the adjustable passband and the second top gate 354 adjusts the second cutoff wavelength at a lower edge of the adjustable passband. Thus, the differential output predominately corresponds to an amplitude of the incident electromagnetic radiation within the adjustable passband. The adjustable passband is adjusted successively in a periodic cycle through a plurality of passbands for hyperspectral imaging with each of the imaging pixels measuring the amplitude for each of the passbands during the periodic cycle.

From the above description of Differential Amplifier Gated with Quantum Dots Absorbing Incident Electromagnetic Radiation, it is manifest that various techniques may be used for implementing the concepts of differential amplifier 100, 300, 400, or array 600 of such differential amplifiers without departing from the scope of the claims. The described embodiments are to be considered in all respects as illustrative and not restrictive. The method/apparatus disclosed herein may be practiced in the absence of any element that is not specifically claimed and/or disclosed herein. It should also be understood that differential amplifier 100, 300, 400, or array 600 of such differential amplifiers is not limited to the particular embodiments described herein, but is capable of many embodiments without departing from the scope of the claims.

We claim:

1. A differential amplifier gated with quantum dots for absorbing an incident electromagnetic radiation, comprising:
    an unmatched pair including a first and second plurality of quantum dots for respectively absorbing a first and second spectrum, wherein the unmatched pair has a difference between the first spectrum absorbed by the first quantum dots and the second spectrum absorbed by the second quantum dots; and
    a matched pair of a first and second phototransistor each including a channel, the first quantum dots for absorbing the first spectrum from the incident electromagnetic radiation and gating a first current through the channel of the first phototransistor, and the second quantum dots for absorbing the second spectrum from the incident electromagnetic radiation and gating a second current through the channel of the second phototransistor,
    wherein the first and second phototransistors are coupled together for generating a differential output from the first and second currents, the differential output corresponding to the difference between the first and second spectrums within the incident electromagnetic radiation.

2. The differential amplifier of claim 1, wherein the differential output is a differential voltage proportional to the difference obtained from subtracting the second spectrum within the incident electromagnetic radiation from the first spectrum within the incident electromagnetic radiation.

3. The differential amplifier of claim 1, wherein the channel of the first phototransistor and the channel of the second phototransistor are composed of a two-dimensional nanomaterial, a semiconductor, and/or a semi-metal.

4. The differential amplifier of claim 3, wherein the channel of the first phototransistor and the channel of the second phototransistor are composed of graphene, which is both the two-dimensional nanomaterial and the semi-metal.

5. The differential amplifier of claim 1, wherein:
    the first and second pluralities of quantum dots are all composed of a same material or same materials,
    but a size and/or a shape of a geometry the first quantum dots differs from a size and/or a shape of a geometry of the second quantum dots,
    so that the first quantum dots absorb the first spectrum and the second quantum dots absorb the second spectrum with the difference between the first and second spectrums.

6. The differential amplifier of claim 1, wherein:
    the first and second pluralities of quantum dots all have a same size and a same shape for each of a core, a shell, and a surface passivation of a shared geometry of the first and second pluralities of quantum dots,
    but a material composing a particular one of the core, the shell, or the surface passivation for the first quantum dots differs from a material composing the particular one for the second quantum dots,
    so that the first quantum dots absorb the first spectrum and the second quantum dots absorb the second spectrum with the difference between the first and second spectrums.

7. The differential amplifier of claim 1, wherein the unmatched pair further includes:
    a first top gate disposed on the first quantum dots opposite a first heterojunction between the first quantum dots and the channel of the first phototransistor, the first top gate for applying a first bias voltage generating an electric field through the first quantum dots to the channel of the first phototransistor; and
    a second top gate disposed on the second quantum dots opposite a second heterojunction between the second quantum dots and the channel of the second phototransistor, the second top gate for applying a second bias voltage generating an electric field through the second quantum dots to the channel of the second phototransistor,
    wherein the first and second pluralities of quantum dots included in the unmatched pair are themselves matched to all have a same material, a same size, and a same shape for each of a core, a shell, and a surface passivation of a shared geometry of the first and second pluralities of quantum dots,
    but wherein the first and second bias voltages are arranged to differ, so that the first quantum dots absorb the first spectrum and the second quantum dots absorb the second spectrum with the difference between the first and second spectrums.

8. The differential amplifier of claim 7, wherein further the first bias voltage regulates charge carriers transferring across the first heterojunction and adjusts a Fermi energy level and a transconductance of the channel of the first phototransistor, and the second bias voltage regulates charge carriers transferring across the second heterojunction and adjusts a Fermi energy level and a transconductance of the channel of the second phototransistor.

9. The differential amplifier of claim 1, further comprising:
    a transistor array including at least including a first transistor, a second transistor through a penultimate transistor, and a last transistor in a pool sequence, wherein each of the first, second through penultimate, and last transistors is gated with a respective plurality of quantum dots; and
    an analog multiplexer for connecting a first selected one of the first and second transistors through the penultimate transistor in the pool sequence into the differential amplifier as the first phototransistor gated with the first quantum dots that are the respective quantum dots of the first selected one, and
    the analog multiplexer for connecting a second selected one of the second transistor through the penultimate and last transistors in the pool sequence into the differential amplifier as the second phototransistor gated with the second quantum dots that are the respective quantum dots of the second selected one.

10. The differential amplifier of claim 1, further comprising:
    a differential load coupled to a collector/drain of each of the first and second phototransistors for generating the differential output from the first current through the collector/drain of the first phototransistor and the second current through the collector/drain of the second phototransistor, wherein the differential output is generated between the collector/drain of the first phototransistor and the collector/drain of the second phototransistor; and a current source coupled to both an emitter/source of the first phototransistor and an emitter/source of the second phototransistor for conveying a sum of the first current through the emitter/source of the first phototransistor and the second current through the emitter/source of the second phototransistor.

11. The differential amplifier of claim 10, wherein:

the differential load is selected from the group consisting of: a pair of resistors both coupled to a first terminal of a power supply and respectively coupled to the collector/drain of the first and second phototransistors, a pair of inductors both coupled to the first terminal and respectively coupled to the collector/drain of the first and second phototransistors, and a current mirror that from the first terminal provides and equalizes the first current through the collector/drain of the first phototransistor and the second current through the collector/drain of the second phototransistor; and the current source is selected from the group consisting of: a resistor coupled between a second terminal of the power supply and the emitter/source of both the first and second phototransistors, and a current mirror coupled to the second terminal and reflecting a reference current as the sum of the first current through the emitter/source of the first phototransistor and the second current through the emitter/source of the second phototransistor.

12. The differential amplifier of claim 1,
wherein the first phototransistor includes:
 the channel of the first phototransistor for guiding the first current between a collector/drain and an emitter/source of the first phototransistor,
 a base/gate that includes a heterojunction between the first quantum dots and the channel of the first phototransistor, the heterojunction for transferring charge carriers that gate the first current through the channel of the first phototransistor when the first quantum dots absorb the first spectrum within the incident electromagnetic radiation,
 the collector/drain of the first phototransistor for generating a first output of the differential output between the first output and a second output, and
 the emitter/source of the first phototransistor for coupling together with an emitter/source of the second phototransistor; and
wherein the second phototransistor includes:
 the channel of the second phototransistor for guiding the second current between a collector/drain and the emitter/source of the second phototransistor,
 a base/gate that includes a heterojunction between the second quantum dots and the channel of the second phototransistor, the heterojunction for transferring charge carriers that gate the second current through the channel of the second phototransistor when the second quantum dots absorb the second spectrum within the incident electromagnetic radiation,
 the collector/drain of the second phototransistor for generating the second output of the differential output, and
 the emitter/source of the second phototransistor.

13. The differential amplifier of claim 12, wherein the matched pair includes a back gate shared by the first and second phototransistors, the back gate for adjusting a shared Fermi energy level and a shared transconductance of the channel of the first phototransistor and the channel of the second phototransistor.

14. An electromagnetic spectrum analyzer including the differential amplifier of claim 1, wherein:
 the first quantum dots of the unmatched pair absorb the first spectrum consisting of wavelengths shorter than a first cutoff wavelength at an upper edge of a passband, and
 the second quantum dots of the unmatched pair absorb the second spectrum consisting of wavelengths shorter than a second cutoff wavelength at a lower edge of the passband,
 such that the differential output predominately corresponds to an amplitude of wavelengths of the incident electromagnetic radiation within the passband.

15. An electromagnetic spectrum analyzer including a sequence of instances of the differential amplifier of claim 1 indexed from 1 to N and having a corresponding sequence of spectrums indexed from 1 to N+1, wherein, for each instance with index k from 1 to N in the sequence of instances:
 the first quantum dots of the instance of the differential amplifier absorb the spectrum with index k in the sequence of spectrums, and
 the second quantum dots of the instance of the differential amplifier absorb the spectrum with index k+1 in the sequence of spectrums.

16. The electromagnetic spectrum analyzer of claim 15, wherein:
 the sequence of spectrums indexed from 1 to N+1 has a corresponding sequence of successively shorter cutoff wavelengths indexed from 1 to N+1, and
 each spectrum with index k from 1 to N+1 in the sequence of spectrums consists of wavelengths shorter than the cutoff wavelength k in the sequence of cutoff wavelengths,
 such that the differential output of the instance of the differential amplifier with index k from 1 to N predominately corresponds to an amplitude of wavelengths of the incident electromagnetic radiation within a passband having an upper edge at the cutoff wavelength with index k and a lower edge at the shorter cutoff wavelength with index k+1.

17. A photodetector including the differential amplifier of claim 1, wherein:
 the first quantum dots of the unmatched pair absorb the first spectrum consisting of wavelengths shorter than a first cutoff wavelength at an upper edge of an amplitude modulation band, and
 the second quantum dots of the unmatched pair absorb the second spectrum consisting of wavelengths shorter than a second cutoff wavelength at a lower edge of the amplitude modulation band,
 such that the differential output predominately corresponds to an amplitude modulation of the incident electromagnetic radiation within the amplitude modulation band.

18. A photodetector including an array of imaging pixels each including an instance of the differential amplifier of claim 1, wherein for the instance within each of the pixels:

the first quantum dots of the unmatched pair absorb the first spectrum consisting of wavelengths shorter than an adjustable first cutoff wavelength at an upper edge of an adjustable passband, and the second quantum dots of the unmatched pair absorb the second spectrum consisting of wavelengths shorter than an adjustable second cutoff wavelength at a lower edge of the adjustable passband, such that the differential output predominately corresponds to an amplitude of the incident electromagnetic radiation within the adjustable passband, which is adjusted successively in a periodic cycle through a plurality of passbands for hyperspectral imaging with each of the plurality of imaging pixels measuring the amplitude for each of the plurality of passbands during the periodic cycle.

19. A photodetector including a first and second instance of the differential amplifier of claim 1 and having a corresponding sequence of a first, second, and third spectrum respectively having a first, second, and third cutoff wavelength that are successively shorter, wherein:

the first quantum dots of the first instance absorb the first spectrum consisting of wavelengths shorter than the first cutoff wavelength, the second quantum dots of the first instance and the first quantum dots of the second instance both absorb the second spectrum consisting of wavelengths shorter than the second cutoff wavelength, and the second quantum dots of the second instance absorb the third spectrum consisting of wavelengths shorter than the third cutoff wavelength, such that the differential output of the first instance predominately corresponds to an amplitude of wavelengths of the incident electromagnetic radiation within a first band having an upper edge at the first cutoff wavelength and a lower edge at the shorter second cutoff wavelength, and such that the differential output of the second instance predominately corresponds to an amplitude of wavelengths of the incident electromagnetic radiation within a second band having an upper edge at the second cutoff wavelength and a lower edge at the shorter third cutoff wavelength.

20. The photodetector of claim 19, wherein:

for the incident electromagnetic radiation that has binary frequency modulation between a first wavelength within the first band and a second wavelength within the second band, a comparison of the differential output of the first instance and the differential output of the second instance corresponds to a decoding of the binary frequency modulation; and for the incident electromagnetic radiation that has an amplitude and frequency modulation including binary frequency modulation between a first wavelength within the first band and a second wavelength within the second band, and including binary on/off amplitude modulation of each of the first and second wavelengths of the binary frequency modulation, a combination of the differential output of the first instance and the differential output of the second instance corresponds to a decoding of the amplitude and frequency modulation.

21. The differential amplifier of claim 1, wherein:

the first and second pluralities of quantum dots all have a same size and a same shape for each of a core, and a surface passivation of a shared geometry of the first and second pluralities of quantum dots, but a material composing a particular one of the core, or the surface passivation for the first quantum dots differs from a material composing the particular one for the second quantum dots, so that the first quantum dots absorb the first spectrum and the second quantum dots absorb the second spectrum with the difference between the first and second spectrums.

22. The differential amplifier of claim 1, wherein the unmatched pair further includes:

a first top gate disposed on the first quantum dots opposite a first heterojunction between the first quantum dots and the channel of the first phototransistor, the first top gate for applying a first bias voltage generating an electric field through the first quantum dots to the channel of the first phototransistor; and a second top gate disposed on the second quantum dots opposite a second heterojunction between the second quantum dots and the channel of the second phototransistor, the second top gate for applying a second bias voltage generating an electric field through the second quantum dots to the channel of the second phototransistor, wherein the first and second pluralities of quantum dots included in the unmatched pair are themselves matched to all have a same material, a same size, and a same shape for each of a core, and a surface passivation of a shared geometry of the first and second pluralities of quantum dots, but wherein the first and second bias voltages are arranged to differ, so that the first quantum dots absorb the first spectrum and the second quantum dots absorb the second spectrum with the difference between the first and second spectrums.

23. The differential amplifier of claim 22, wherein further the first bias voltage regulates charge carriers transferring across the first heterojunction and adjusts a Fermi energy level and a transconductance of the channel of the first phototransistor, and the second bias voltage regulates charge carriers transferring across the second heterojunction and adjusts a Fermi energy level and a transconductance of the channel of the second phototransistor.

* * * * *